United States Patent [19] [11] 4,453,172
Farrow et al. [45] Jun. 5, 1984

[54] FIELD EFFECT TRANSISTOR WITH GATE INSULATION OF CUBIC FLUORIDE MATERIAL

[75] Inventors: Robin F. C. Farrow; Gordon R. Jones; Philip W. Sullivan, all of Malvern, England

[73] Assignee: The Secretary of State for Defence in Her Britannic Majesty's Government of the United Kingdom of Great Britain and Northern Ireland, London, England

[21] Appl. No.: 326,234

[22] Filed: Dec. 1, 1981

[30] Foreign Application Priority Data

Dec. 23, 1980 [GB] United Kingdom ............... 8041169

[51] Int. Cl.³ ............... H01L 29/78; H01L 27/12; H01L 45/00; H01L 49/02
[52] U.S. Cl. ............... 357/23.15; 357/4; 357/23.7
[58] Field of Search ............... 357/23 I, 23 TF, 4

[56] References Cited

U.S. PATENT DOCUMENTS 3,304,469  2/1967  Weimer ............... 357/23 TF
3,355,637 11/1967  Johnson ............... 357/23 I
3,969,743  7/1976  Gorski ............... 357/4

Primary Examiner—Martin H. Edlow
Assistant Examiner—Jerome Jackson
Attorney, Agent, or Firm—Pollock, VandeSande and Priddy

[57] ABSTRACT

An FET device comprises a substrate with source and drain regions separated by a gate structure. Between the gate and substrate is an insulator formed of a cubic fluorite structure material that is lattice matched within 1% to the substrate. The insulator may be a group II fluoride such as $Ca_yCd_{1-y}F_2$ ($0 \leq y \leq 1$), $Sr_zBa_{1-z}F_2$ ($0 \leq z \leq 1$), or $Ba_xCa_{1-x}F_2$ ($0 \leq x \leq 1$), or an oxide such as $CeO_2$, $PbO_2$. The substrate may be a bulk semiconductor or an epitaxial layer such as Si, InP, GaAs, $Ga_xAl_{1-x}As$, GaSb, InAs, or AlAs.

6 Claims, 5 Drawing Figures

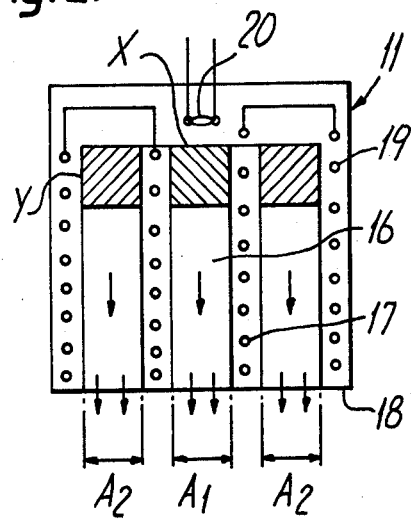
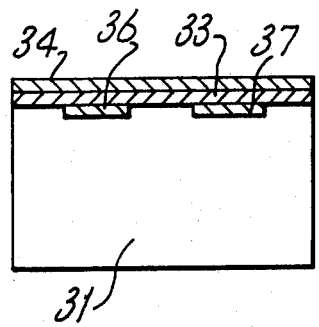
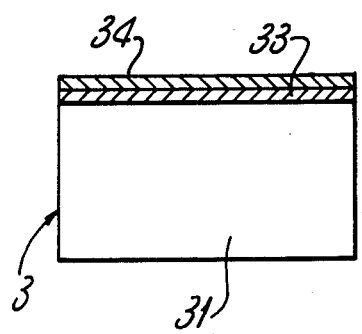
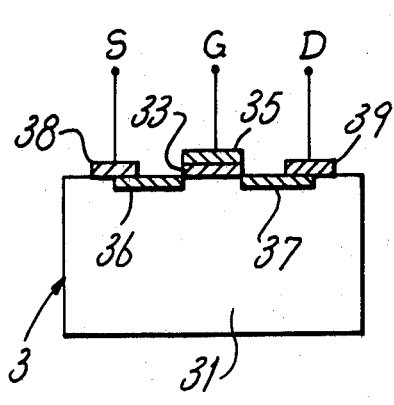

FIELD EFFECT TRANSISTOR WITH GATE INSULATION OF CUBIC FLUORIDE MATERIAL

The invention relates to field effect transistors (F.E.T.) and to a method of making them.

An F.E.T. is a three terminal device having source and drain regions spaced apart on a substrate. A gate arranged between the source and drain regions is separated from the substrate by an insulating layer e.g. an oxide layer. The term M.O.S.F.E.T. or M.I.S.F.E.T. describes such a device i.e. metal-insulator(or oxide)-semiconductor-field-effect-transistor. Typical substrate materials are silicon, and indium phosphide, and insulators of silicon oxide and aluminum oxide.

In an enhancement mode M.I.S.F.E.T. a conducting channel is formed in the top 50 Å of substrate under the gate by a voltage applied to the gate. The gate voltage controls current between source and drain regions. Since the conducting channel is so shallow it is important to obtain a good substrate insulator interface e.g. by careful substrate cleaning prior to depositing the insulator.

The known techniques of molecular beam epitaxy (MBE) offer the prospect of clean substrates because the process is carried out under ultra high vacuum conditions.

According to this invention in a MISFET device the insulating layer between a gate and semiconductor substrate is characterized in that the insulator is a cubic fluorite structure material and that the lattice parameter of the substrate and the insulator are less than 1% different to one another.

When depositing a crystalline insulating layer on a crystalline substrate a degree of lattice mismatch can be tolerated. If the lattice parameters of the two are close, then the grown layer will deform by compression or extension with a consequential change in the lattice structure across the thickness of the layer; the two deformations being related by Poisson's ratio. The lattice parameter is also known as the lattice constant and is the edge length of a unit cell.

Large lattice mismatch gives considerable atomic strain with periodic defects e.g. slip planes that may propagate into the bulk of the substrates. Present FET devices using conventional insulators have considerable lattice mismatch, with consequential defects at the substrate/insulator interface.

The present invention improves this interface by providing an insulator that is sufficiently lattice matched to the substrate to provide a substantially defect free interface. The difference between the lattice parameters of substrate and insulator are less than about 1%, preferably less than 0.5%, and ideally zero mismatch.

The substrate may be Si, InP, GaAs, $Ga_xAl_{1-x}As$, GaSb, InAs, AlAs, with or without a high quality epitaxial layer. The insulator may be: group II fluorides eg $Ca_yCd_{1-y}F_2 (0 \leq y \leq 1)$, for Si substrates; $Sr_zBa_{1-z}F_2$ $(0 \leq z \leq 1)$, for InP substrates; $Ba_xCa_{1-x}F_2$ $(0 \leq x \leq 1)$; the oxides $CeO_2$; $PbO_2$; or mixtures of fluorides and oxides.

The value of x is variable between 0 and 1 to give a lattice parameter between 5.464 and 6.200 i.e. tailored to match InP or GaAs substrates.

According to this invention a method of making an FET comprises the steps of cleaning a substrate under ultra high vacuum conditions, depositing under high vacuum conditions an insulating layer by molecular beam evaporation onto the epitaxial layer, the lattice of insulator and epitaxial layer being substantially matched, and providing a gate electrode on the insulating layer, and source and drain regions either side the gate electrode.

For certain device structures it may be necessary to include an epitaxial semiconductor layer, grown also by molecular beam epitaxy before the insulator layer is provided.

The invention will now be described by way of example only, with reference to the accompanying drawings of which:

FIG. 2 shows schematically a double Knudsen oven forming part of the apparatus of FIG. 1 and drawn to an enlarged scale;

Figure 1:
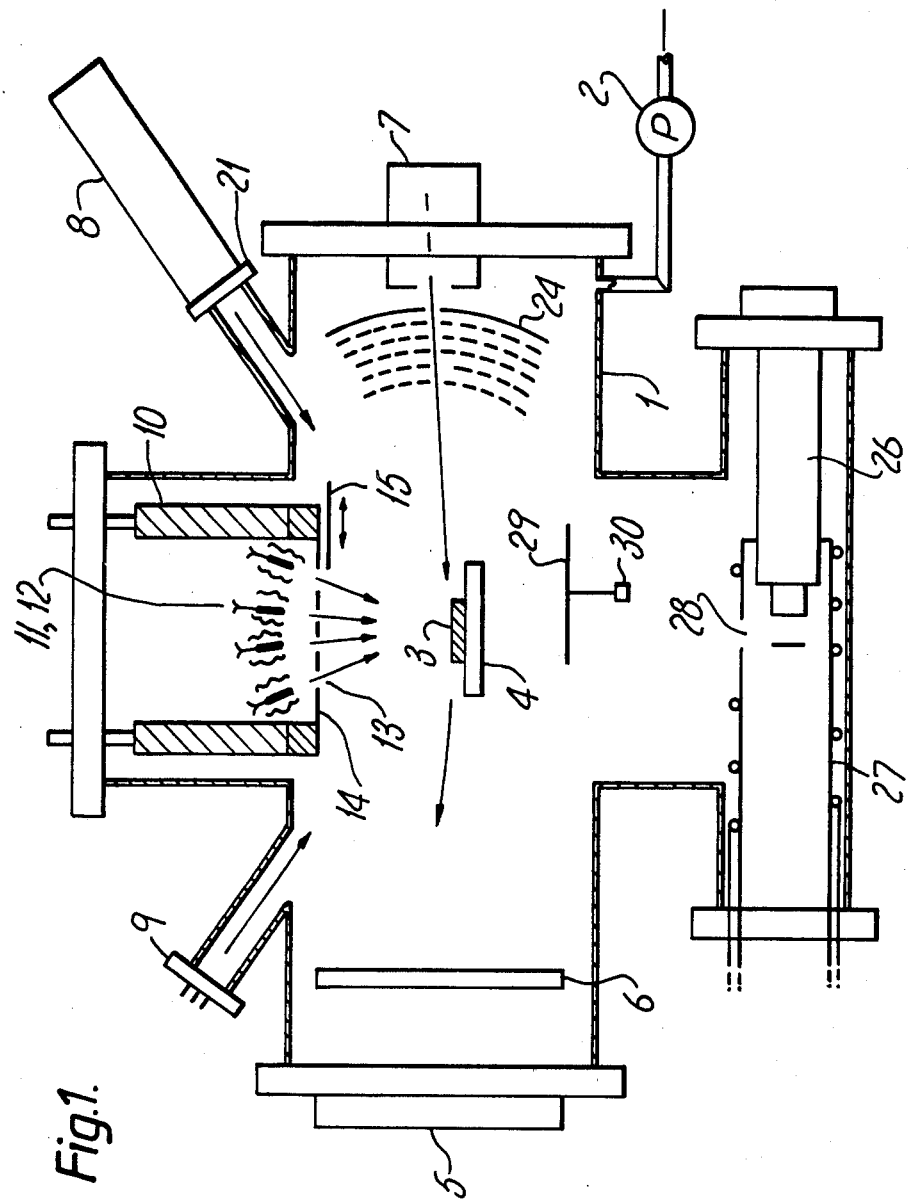
FIG. 1 shows molecular beam evaporation (MBE) apparatus for growing an insulating layer on a substrate in the production of an FET device.

FIGS. 3a, b, c are cross sections of a substrate during manufacture of an FET device not drawn to scale.

As shown in FIG. 1 the MBE apparatus comprises a vacuum chamber 1 which in operation is evacuated to about $10^{-9}$ Torr. by a vacuum pump 2. A substrate 3 is mounted on a substrate holder 4 incorporating electrical resistance heating elements. Observation of the diffraction pattern from substrate 3 is through a window 5 on a viewing screen 6 which receives electrons from an electron gun 7 after deflection from the substrate 3. A well-ordered substrate surface is indicated by the presence of a clearly defined diffraction pattern. Impurities in the substrate 3 are determined by rotating the substrate and analyzing the energy of the secondary electrons emitted from the substrate 3 into the Auger optics 24 when illuminated by the electron gun 7. An argon ion gun 9 provides a source of argon ions for cleaning and heating the substrate 3.

Above the substrate 3 and within a liquid nitrogen shield 10 are molecular beam ovens 11 and an electron gun (e.-gun) 12 each arranged in alignment with an aperture 13 in a wall 14. A shutter 15 is movable across the wall 14 to selectively cover the apertures 13.

The ovens 11 may be the known Knudsen ovens comprising an electrically heated tube containing a source material e.g. In, InP, etc. Temperature in the ovens is monitored by thermocouples and controlled by varying the power input to the oven to control the evaporation of the source material and hence molecular beam density.

FIG. 2 shows a double Knudsen oven 11 one inside the other. The inner oven 16 has an outlet of area $A_1$, is heated by resistance heater wires 17 and contains source material X. The outer oven 18 has an annular outlet of area $A_2$, is heated by resistance wires 19, and contains a source material Y. Temperature of both ovens 16, 18 is kept the same and monitored by a thermocouple 20.

The output from the double oven 11 is a mixed beam having the composition $P_1A_1/P_2A_2 = X/Y$, where $P_1$ and $P_2$ are the vapor pressures of the materials X and Y. Thus the composition of the deposited material is controlled by the relative areas $A_1$ and $A_2$, and temperature.

Under the substrate 3, in the MBE chamber 1 (FIG. 1), is a quadrupole mass spectrometer 26 contained within a nitrogen shield 27 provided with an aperture 28, through which molecules may enter. A chopper 29 rotated by an electric motor 30 chops the molecular beams from the ovens 11 onto the spectrometer 26.

Thus growth of materials onto the substrate 3 can be monitored by the spectrometer 26 at all times. A laser 8 is mounted above a sapphire window 21 on the chamber 1 for heating the substrate.

Manufacture of a silicon MISFET will now be described with reference to FIGS. 1, 3a, b, c. Two approaches to the manufacture are described. First, the use of a wafer with the source and drain areas prepared prior to deposition, and second the use of a wafer without source and drain areas. The methods of providing source and drain areas are well known and could include diffusion of n or p dopants in the wafer or the use of ion implantation methods. Where the source and drain regions were provided prior to insulator deposition, the resultant FET would not have a perfectly aligned gate region. To produce a 'self-aligned' gate structure, the source and drain regions are provided after the insulator deposition, with the insulator being a mask to ensure perfect alignment. A silicon wafer 31 is loaded into the chamber 1 which is then evacuated to less than $10^{-9}$ Torr. The slice 31 is then heat-cleaned by heating to about 1200° C. for a few minutes or preferably by heating the surface with the laser 8 beam.

As soon as the heat-cleaning is completed the shutter 15 is controlled to allow a beam of $CaF_2$ from an oven 11 (previously brought up to temperature) to impinge on the substrate 31 until a layer 33 of up to 2,000 Å thickness has been formed. The substrate temperature is kept at 200° C. during this growth. At room temperature the lattice parameter for Si is 5.4308 Å and $CaF_2$ is 5.462 Å, and the lattice mismatch is ≃0.6%.

To achieve a closer lattice match the insulating layer 33 may be a mixture of approximately 40% $CdF_2$ and 60% $CaF_2$ grown by simultaneous molecular beams from ovens containing $CdF_2$ and $CaF_2$, the proportions being obtained by different temperatures of the two ovens or a mixed beam of the appropriate composition generated from the double oven 11 described above. The latter method may be preferred to achieve a higher compositional uniformity across the silicon substrate.

Since the insulating layer 33 is now protecting the interface, subsequent device fabrication may be carried out in a different apparatus not requiring ultra high vacuum. However, it may be preferable to use the MBE chamber to provide the metal layer 34, for example aluminum. A gate electrode 35 is defined and the insulator/metal in the source and drain region is etched out using known photolithographic and chemical treatments. Metal contact pads 38, 39 e.g. Al are evaporated through masks onto the source and drain regions 36, 37 respectively. This procedure provides a non-aligned gate FET structure.

The substrate 3 is mounted inside a can and thin lead wires bonded to the source 38, gate 35 and drain 39 contact pads in the conventional manner.

To provide a 'self-aligned' gate FET structure a wafer 31 is coated with an insulator layer 33 and metal layer 34 as described above, and the gate electrode 35 is shaped and the remainder of the insulating layer 33 and metal 34 is etched out, to expose the surface of the wafer 31. Source and drain areas are provided by ion implantation of the appropriate doping species using conventional techniques, and the gate insulator and metal structure provides the mask to ensure a self-aligned structure. The amorphous ion implanted source 36 and drain 37 regions are annealed with a laser to provide good electrical activation and a crystalline semiconductor lattice. Metal contact pads 38, 39 of Al are provided for the source and drain regions 36, 37 respectively. The substrate 3 is mounted inside a can and thin lead wires bonded to the source 38, gate 35 and drain 39 contact pads in the conventional manner.

For some devices a silicon epitaxial layer may be grown on the silicon substrate 31 by MBE methods prior to depositing the insulating layer 33. The epitaxial layer is deposited by the electron gun 12.

Manufacture of an InP MISFET is similar to that for the Si device above. Two device schemes are described. The first uses a wafer 31 of semi-insulating InP provided with source 36 and drain 37 regions (FIG. 3a) by conventional means prior to insulator deposition, and the second approach provides source 36 and drain 37 regions after insulator deposition to ensure a self-aligned FET structure (FIG. 3c).

A wafer 31 is mounted on the substrate holder 4 in the chamber 1 which is then evacuated to less than $10^{-9}$ Torr. The wafer 31 is then heat-cleaned using a known technique e.g. as described in U.K. Patent Specification No. 1,528,192. Immediately after heat-cleaning the shutter 15 is moved to allow deposition of $SrF_2$ from a single oven source 11, previously brought up to the required temperature. A layer up to 2,000 Å thick is grown.

The lattice parameter for InP at room temperature is 5.869 Å and for $SrF_2$ is 5.794 Å, resulting in a mismatch of ~1.3%. Better lattice matching is achieved by depositing a mixed layer of ~20% $BaF_2$ and ~80% $SrF_2$ from a double oven source described above or using two independently heated single ovens.

Where the source and drain areas are defined prior to insulator deposition (FIG. 3a) the gate region 35 is defined photolithographically using conventional methods, and the insulator 33 and metal 34 are etched out in the region of the source and drain areas. Metal contact pads 38, 39 e.g. Al are evaporated through a mask onto the source 36 and drain 37 areas. This procedure provides a non-aligned gate FET structure.

A 'self-aligned' gate FET structure is manufactured using a wafer 31 coated with an insulator 33 and metal 34 as described above (FIG. 3b). The gate electrode 35 is shaped, and the insulator 33 and metal 34 are etched away in those areas which will be used to provide a source and drain region. The self-aligned structure is produced by the use of the gate electrode 35 as a mask during preparation of the $n^+$ source and drain regions may be produced by conventional ion implantation and annealing methods. Metal contact pads 38, 39 are evaporated on the source and drain regions 36, 37 as before.

Gallium arsenide FET devices may be produced in a manner similar to that for Si devices. A GaAs substrate is cleaned by heating to about 580° C. in a vacuum of about $10^{-9}$ Torr. Small amounts of As may be introduced into the chamber 1 during heat cleaning. The substrate is heated to about 200° C. for growth of the $CaBaF_2$ insulator. Source, drain and gate are then produced as described above.

The following table gives exact insulator compositions for exact lattice matching:

| Substrate | Insulator | Lattice mismatch 25° C. | 200° C. |
| --- | --- | --- | --- |
| Si | $Ca_{0.58}Cd_{0.42}F_2$ | 0 | + 0.29 |
| InP | $Sr_{0.8}Ba_{0.2}F_2$ | 0 | + 0.22 |
| InP | $Ca_{0.45}Ba_{0.55}F_2$ | 0 | + 0.23 |
| GaAs | $Ca_{0.26}Ba_{0.74}F_2$ | 0 | + 0.22 |

Insulator layers of oxides are obtained in the chamber 1 as described above. For example the Knudsen ovens contain $CeO_2$ and $O_2$ in separate chambers to give the required deposition composition. The substrates are heated to 200° C. or higher during insulator growth.

What I claim is:

1. A field effect transistor device comprising a semiconductor substrate, source and drain regions spaced apart on the substrate, and a gate arranged between the source and drain regions and separated from the substrate by a layer of electrically insulating material, the insulating layer being a cubic fluorite structure material selected from the group containing $Ca_yCd_{1-y}F_2$ where $0<y<1$,
$Sr_zBa_{1-z}F_2$ where $0<z<1$,
$Ba_xCa_{1-x}F_2$ where $0<x<1$, having a lattice parameter that is different from the lattice parameter of the substrate by less than 1% over a temperature range of 25° C. to 200° C.

2. A device according to claim 1 wherein the substrate is selected from the group containing Si, InP, GaAs, $Ga_xAl_{1-x}As$, GaSb, InAs or AlAs.

3. A device according to claim 2 wherein the substrate is an epitaxial layer formed on a supporting semiconductor material base.

4. A device according to claim 1 wherein the substrate is Si and the insulating material is $Ca_{0.58}Cd_{0.42}F_2$.

5. A device according to claim 1 wherein the substrate is InP and the insulating material is $Sr_{0.8}Ba_{0.2}F_2$ or $Ca_{0.45}Ba_{0.55}F_2$.

6. A device according to claim 1 wherein the substrate is GaAs and the insulating material is $Ca_{0.26}Ba_{0.74}F_2$.

* * * * *